(12) United States Patent
Tsukamoto

(10) Patent No.: US 7,202,465 B2
(45) Date of Patent: Apr. 10, 2007

(54) PHOTOSENSOR AND SOLID STATE IMAGING DEVICE

(75) Inventor: Akira Tsukamoto, Toyonaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 212 days.

(21) Appl. No.: 11/104,789

(22) Filed: Apr. 13, 2005

(65) Prior Publication Data

US 2005/0224696 A1 Oct. 13, 2005

(30) Foreign Application Priority Data

Apr. 13, 2004 (JP) ............................ 2004-118213

(51) Int. Cl.
*H01L 31/00* (2006.01)
(52) U.S. Cl. ................................. 250/214.1; 250/208.1
(58) Field of Classification Search ............ 250/208.1, 250/214.1; 257/431, 432, 435
See application file for complete search history.

(56) References Cited

U.S. PATENT DOCUMENTS 5,306,926 A * 4/1994 Yonemoto ................. 257/432
6,593,591 B2 * 7/2003 Yudasaka et al. ............ 257/57
6,972,219 B2 * 12/2005 Yukawa ...................... 438/151
2005/0224696 A1 * 10/2005 Tsukamoto ............... 250/214.1
2005/0236553 A1 * 10/2005 Noto et al. ............... 250/208.1

FOREIGN PATENT DOCUMENTS

JP 8-139300 5/1995
JP 2000-252451 9/2000

* cited by examiner

*Primary Examiner*—John R. Lee
(74) *Attorney, Agent, or Firm*—Hamre, Schumann, Mueller & Larson, P.C.

(57) ABSTRACT

The photosensor includes a semiconductor substrate provided with a light receiving portion for converting incident light and a signal readout portion; a light shielding layer formed above the light receiving portion and having an aperture; and a transparent insulating layer formed so as to fill the aperture. A relationship $2nW \geq \lambda max$ is satisfied, where W represents a minimum width of the aperture, n represents an average refractive index of the insulating layer in a region between a position corresponding to the uppermost surface of the light shielding layer and the surface of the light receiving portion, and $\lambda max$ represents a maximum wavelength of the sensitive wavelength range of the light receiving portion. The aperture rate of the light receiving portion can be reduced without causing a sensitivity decrease and a change in spectral characteristics on the long wavelength side of the effective wavelength range.

11 Claims, 3 Drawing Sheets

PHOTOSENSOR AND SOLID STATE IMAGING DEVICE

BACKGROUND OF THE INVENTION

1. Field of the Invention

The present invention relates to the structure of a photosensor used for a solid state imaging device or the like.

2. Description of the Related Art

The structure of one example of a conventional photosensor is described in the following. This example is an interline CCD (Charge-Coupled Device) solid state imaging device having effective sensitivity in the visible light range. FIG. 3A is a top plan view and FIG. 3B is a cross-sectional view illustrating the pixel structure of this conventional solid state imaging device.

The interline CCD solid state imaging device has an array of pixels arranged in a grid pattern and each pixel is made up of a photodiode 4 serving as a light receiving portion and a charge transfer path 5 serving as a signal readout portion. On the surface of the photodiode 4 and charge transfer path 5 is formed a first insulating layer 6. A gate electrode 7 is formed above the charge transfer path 5. The gate electrode 7 is covered by a second insulating layer 8.

To prevent image deterioration known as "smear" caused by photoelectrons that are generated by light that is directly incident on the charge transfer path 5, a light shielding layer 1 is formed above the charge transfer path 5 via the first and second insulating layers 6 and 8.

The light shielding layer 1 has an aperture 2 formed by etching or the like, above the photodiode 4, to allow light to enter the photodiode 4. The region above the photodiode 4 surrounded by the side walls of the aperture 2 in the light shielding layer 1 is filled with a fourth insulating layer 10 of a material having a refractive index of less than 1.50 such as silicon dioxide (see, for example, JP 2000-252451A).

With about 3 µm wide pixels in a solid state imaging device of recent years, the aperture ratio of the light receiving portion is as low as 20% or less, and the usage efficiency of incident light is accordingly low. To reduce the pixel size further, the aperture width W of the light shielding layer 1 would have to be 0.5 µm or less. The problem in that case would be that the long wavelength components of visible light are cut off by the light shielding layer 1 because the aperture width is smaller than the longest wavelength of the visible light range, which is about 800 nm.

The same applies to an amplified MOS solid state imaging device that has neither CCD charge transfer area nor a light shielding layer, because, as the signal line pitch on the pixel is reduced to as small as an effective wavelength, the signal lines function as a phase grating, causing a similar problem.

SUMMARY OF THE INVENTION

An object of the present invention is to provide a photosensor having a structure that enables a reduction of the aperture ratio of a light receiving portion without causing sensitivity degradation and change in spectral characteristics at the long wavelength side of the effective wavelength range.

To achieve the above object, a photosensor according to the present invention includes: a semiconductor substrate provided with a light receiving portion for photoelectrically converting incident light and a signal readout portion for reading out signal charges accumulated in the light receiving portion; a light shielding layer formed above the light receiving portion and having an aperture; and a transparent insulating layer formed so as to fill the aperture; wherein a relationship $2nW \geq \lambda_{max}$ is satisfied, where W represents a minimum width of the aperture in the light shielding layer, n represents an average refractive index of the insulating layer in a region between a position corresponding to the uppermost surface of the light shielding layer along the aperture and the surface of the light receiving portion, and $\lambda_{max}$ represents a maximum wavelength of the sensitive wavelength range of the light receiving portion.

DESCRIPTION OF THE PREFERRED EMBODIMENTS

According to the photosensor of the present invention, the minimum width W of the aperture in the light shielding layer, the average refractive index n of the insulating layer filling the aperture on the light receiving portion, and the maximum wavelength $\lambda_{max}$ of the sensitive (effective) wavelength range are set so as to satisfy the relationship $2nW \geq \lambda_{max}$, whereby sensitivity degradation and change in spectral characteristics on the long wavelength side of the effective wavelength range are suppressed.

Preferably, a relationship $nW \geq \lambda_{max}$ is satisfied, and more preferably, a relationship $nW/2 \geq \lambda_{max}$ is satisfied.

The photosensor having the above design further may include a color filter provided above the aperture, the maximum wavelength $\lambda_{max}$ being a cutoff wavelength on the long wavelength side of the spectral characteristics of the color filter.

In this configuration, a plurality of the light receiving portions may be arranged on the semiconductor substrate, each light receiving portion having the aperture, and one of plural kinds of color filters having different spectral characteristics may be provided above each of the apertures. Further, the minimum width W may be determined with respect to the maximum wavelength $\lambda_{max}$ represented by a cutoff wavelength on the long wavelength side of the one of the plural kinds of color filters that has a longest cutoff wavelength on the long wavelength side.

Alternatively, in a configuration in which a plurality of the light receiving portions are arranged on the semiconductor substrate, each light receiving portion having the aperture, and one of plural kinds of color filters having different spectral characteristics is provided above each of the apertures, the apertures may have different minimum widths W in accordance with the kinds of the color filters. The minimum widths W of the apertures may be determined with respect to the respective cutoff wavelengths on the long wavelength side of the spectral characteristics of the respective color filters so as to satisfy the relationship.

The average refractive index n of the insulating layer may be at least 1.50. The insulating layer may be a silicon oxynitride film or a multilayer film including a silicon oxynitride film. Alternatively, the insulating layer may be a silicon nitride film or a multilayer film including a silicon nitride film. Alternatively, the insulating layer may be a silicon carbide film or a multilayer film including a silicon carbide film.

A solid state imaging device may be constructed using the photosensor having one of the above described configurations and circuits for processing signals obtained from the photosensor.

Hereinafter, a photosensor and a solid state imaging device using the same according to an embodiment of the present invention are described with reference to the accompanying drawings.

Figure 1A:
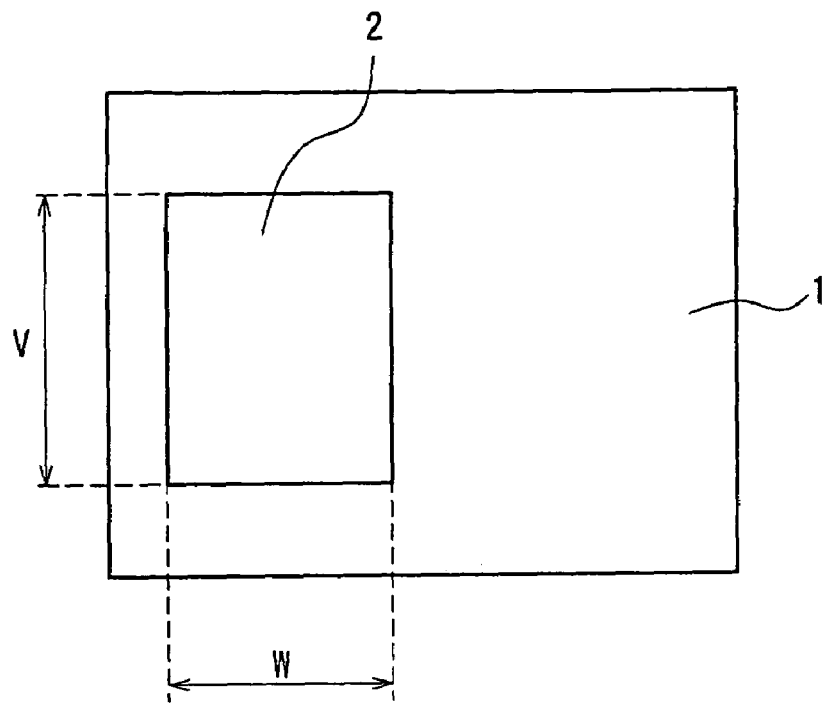
FIG. 1A is a plan view and FIG. 1B is a cross-sectional view illustrating the structure of a pixel in one embodiment of the solid state imaging device of the invention.
Figure 1B:
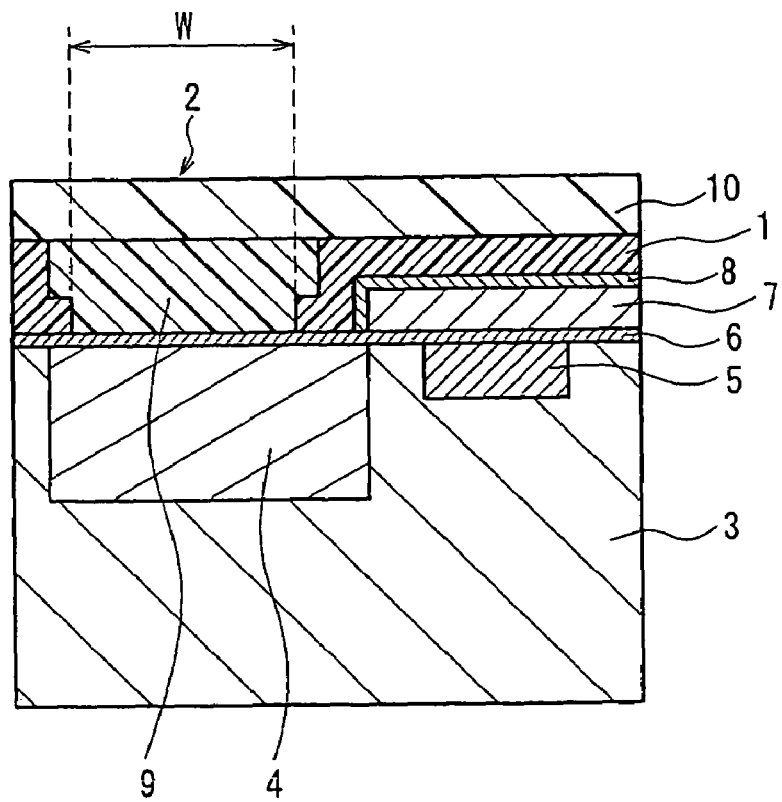
Figure 3A:
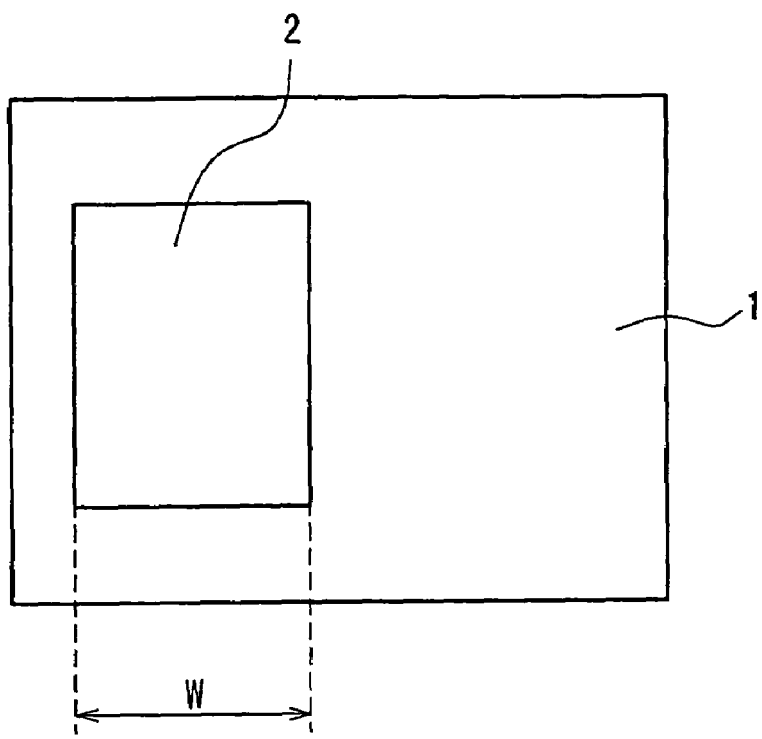
FIG. 3A is a plan view and FIG. 3B is a cross-sectional view illustrating the pixel structure of a conventional solid state imaging device.
Figure 3B:
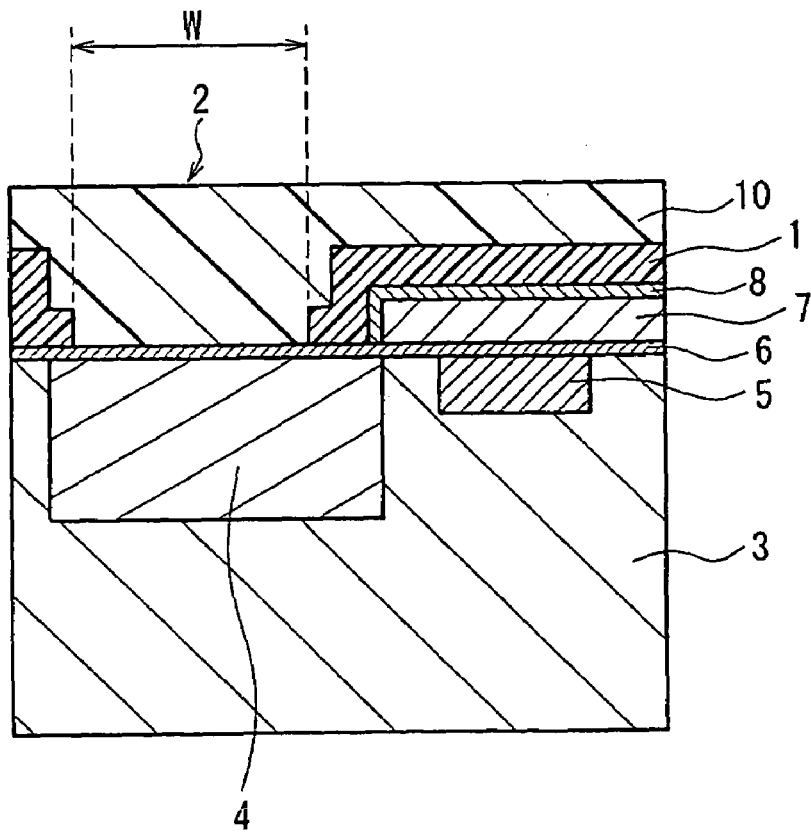

FIG. 1A is a top plan view and FIG. 1B is a cross-sectional view illustrating the structure of a pixel in one embodiment of the solid state imaging device of the invention. The structure is basically the same as that of the conventional example shown in FIGS. 3A and 3B and the same elements are denoted by the same reference numerals. The difference between this embodiment and the conventional example shown in FIGS. 3A and 3B is that the fourth insulating layer 10 shown in FIG. 3B is replaced with a combination of a third insulating layer 9 as a lower layer and an fourth insulating layer 10 as an upper layer disposed thereon.

Each pixel of the solid state imaging device comprises a photodiode 4 serving as a light receiving portion and a charge transfer path 5 serving as a signal readout portion formed on a semiconductor substrate 3. Above the charge transfer path 5 is formed a gate electrode 7 via a first insulating layer 6 to form a CCD charge transfer area. Above the gate electrode 7 is formed a light shielding layer 1 via a second insulating layer 8. In the light shielding layer 1 is formed an aperture 2 located above the photodiode 4. The region of the light shielding layer 1 surrounded by the walls of the aperture 2 above the photodiode 4 is filled with a third insulating layer 9 having a refractive index n. The insulating layer 9 is covered with a fourth insulating layer 10.

Figure 2:
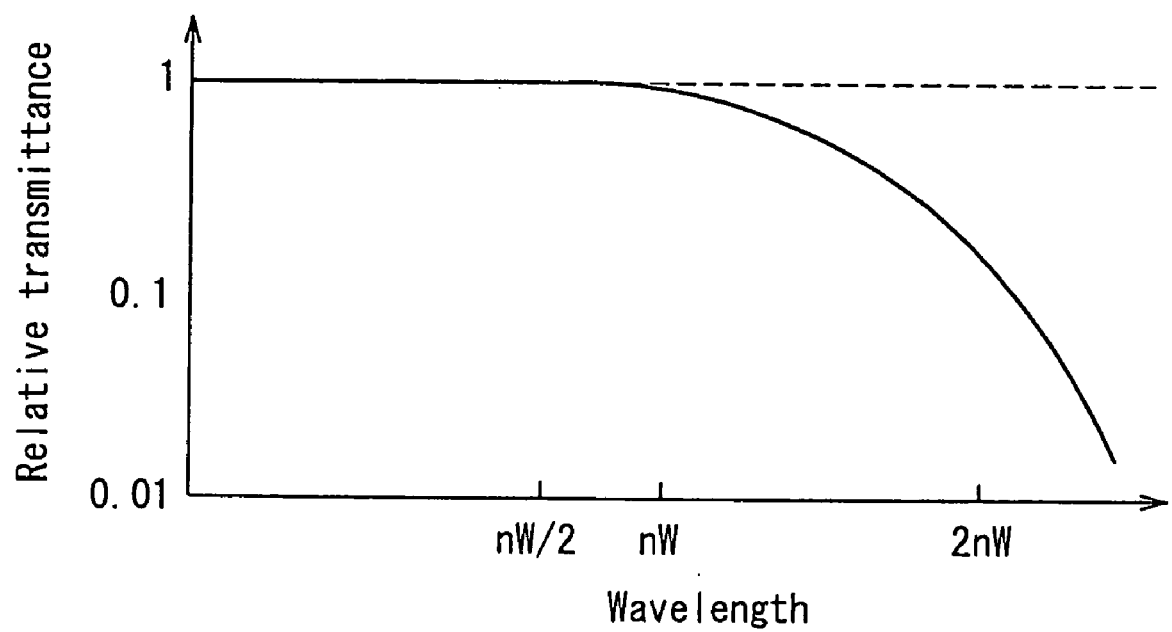
FIG. 2 is a diagram illustrating the wavelength dependency of light transmittance of the light shielding layer in one embodiment.

In FIG. 1A, W represents the minimum width of the aperture 2 in the light shielding layer 1. V represents the maximum width of the aperture 2. FIG. 2 shows the wavelength dependency of the light transmittance of the light shielding layer 1.

Generally, as shown in FIG. 2, when the aperture 2 has a minimum width W, the transmittance reduces drastically at a wavelength of $\lambda 0=2nW$ or more, at which a standing wave is generated. Thus, by setting the parameters n, and W so as to satisfy the relationship $2nW \geq \lambda max$, wherein $\lambda max$ represents the maximum wavelength of the sensitive (effective) wavelength range, sensitivity degradation of the photodiode 4 on the long wavelength side of the effective wavelength range is suppressed.

At a wavelength $\lambda 1=nW$, as shown in FIG. 2, the decrease of the transmittance is less than that at $\lambda 0=2nW$. Therefore, by setting the parameters so as to satisfy the relationship $nW \geq \lambda max$, the sensitivity on the long wavelength side is further improved.

At a wavelength $\lambda 1=nW$, as shown in FIG. 2, however, the transmittance still decreases by about 10% compared with that at a wavelength in a region where the transmittance does not decrease. Since there is no perceivable change in the frequency characteristics (spectral characteristics) if $\lambda 2 \leq nW/2$, the parameters should preferably be set so as to satisfy the relationship $nW/2 \geq \lambda max$.

First Examples

The followings are examples in which the minimum width W of the aperture 2 and the refractive index n of the third insulating layer 9 are set with respect to the maximum wavelength $\lambda max$ of the effective wavelength range of the solid state imaging device so as to satisfy the relationship $2nW \geq \lambda max$.

In an optical device with an effective wavelength range corresponding to a visible light wavelength range, $\lambda max$ is about 800 nm. Therefore table 1 shows examples of combinations of the material for the third insulating layer 9, its refractive index n, and minimum width W of the aperture 2 that can satisfy the equation $\lambda max=2nW=800$ nm. Generally, the maximum wavelength $\lambda max$ is determined from a cutoff wavelength on the long wavelength side of the spectral characteristics of a color filter disposed above the aperture 2.

TABLE 1

Examples of combinations that satisfy 2nW = 800 nm

| Combination | | Material of third insulating layer | Refractive index n | Minimum width W of aperture |
|---|---|---|---|---|
| 1 | conv. ex. | silicon dioxide (SiO$_2$) | 1.45 | 275 nm |
| 2 | present | silicon oxynitride (SiOxNy) | 1.50 | 266 nm |
| 3 | invention | silicon oxynitride (SiOxNy) | 1.60 | 250 nm |
| 4 | | silicon oxynitride (SiOxNy) | 1.80 | 222 nm |
| 5 | | silicon nitride (SiNx) | 2.00 | 200 nm |
| 6 | | silicon carbide (SiCx) | 2.20 | 181 nm |

The conventional example did not use the third insulating layer 9 and had only the fourth insulating layer 10 made of silicon dioxide (SiO$_2$). Therefore, when the minimum width W of the aperture 2 is smaller than 275 nm as shown in the combination example 1, the transmittance in the long wavelength range is decreased, resulting in a drastic reduction of a sensitivity. In effect, however, if the maximum width V of the aperture 2 is sufficiently large, the transmittance of some polarized light components does not greatly decrease, so that a large decrease of the overall transmittance is mitigated.

On the other hand, in examples of the solid state imaging device according to the embodiment of the invention, the third insulating layer 9 is made of a material having a higher refractive index than conventionally used materials as shown in the combination examples 2 to 6, whereby sensitivity degradation in the effective wavelength range is suppressed and the minimum width W of the aperture 2 is made smaller.

Second Examples

Even with the combinations of the material for the third insulating layer 9, refractive index n, and minimum width W of the aperture 2 that satisfy $\lambda max=2nW$ of the above-described example, there is a sensitivity decrease of several tens % at the maximum wavelength $\lambda$ in the effective wavelength range. Therefore, it is preferable to design the device so as to satisfy the equation $\lambda max=nW$, in order to design a solid state imaging device having an effective wavelength range in the visible wavelength range.

Table 2 shows examples of the combinations of the material for the third insulating layer 9, its refractive index n, and minimum width W of the aperture 2 that satisfy the equation $\lambda max=nW=800$ nm.

TABLE 2

Examples of combinations that satisfy nW = 800 nm

| Combination | | Material of third insulating layer | Refractive index n | Minimum width W of aperture |
|---|---|---|---|---|
| 7 | conv. ex. | silicon dioxide (SiO$_2$) | 1.45 | 551 nm |
| 8 | present | silicon oxynitride (SiO$x$N$y$) | 1.50 | 533 nm |
| 9 | invention | silicon oxynitride (SiO$x$N$y$) | 1.60 | 500 nm |
| 10 | | silicon oxynitride (SiO$x$N$y$) | 1.80 | 444 nm |
| 11 | | silicon nitride (SiN$x$) | 2.00 | 400 nm |
| 12 | | silicon carbide (SiC$x$) | 2.20 | 363 nm |

The conventional example did not use the third insulating layer 9 and had only the fourth insulating layer 10 made of silicon dioxide (SiO$_2$). Therefore, when the minimum width W of the aperture 2 is smaller than 551 as shown in the combination example 7, the transmittance in the long wavelength range is decreased, resulting in a reduction of a sensitivity by about 10%. In effect, however, if the maximum width V of the aperture 2 is sufficiently large, the transmittance of some polarized light components does not greatly decrease, so that a large decrease of the overall transmittance is mitigated.

On the other hand, in examples of the solid state imaging device according to the embodiment of the invention, the third insulating layer 9 is made of a material having a higher refractive index than conventionally used materials as shown in the combination examples 8 to 12, whereby the minimum width W of the aperture 2 can be made smaller without changing the effective wavelength range of the optical device.

Third Examples

Even with the combinations of the material for the third insulating layer 9, refractive index n, and minimum width W of the aperture 2 that satisfy λmax=nW of the above-described second examples, there is a sensitivity decrease of about 10% at the maximum wavelength λ in the effective wavelength range. If the solid state imaging device is designed to have an effective wavelength range in the visible wavelength range based on a combination of the parameters satisfying the equation λmax=nW/2, then it is possible to suppress sufficiently perceivable change in the spectral characteristics.

Table 3 shows examples of combinations of the material for the third insulating layer 9, its refractive index n, and minimum width W of the aperture 2 that satisfy the equation λmax=nW/2.

TABLE 3

Examples of combinations that satisfy nW/2 = 800 nm

| Combination | | Material of third insulating layer | Refractive index n | Minimum width W of aperture |
|---|---|---|---|---|
| 13 | conv. ex. | silicon dioxide (SiO$_2$) | 1.45 | 1103 nm |
| 14 | present | silicon oxynitride (SiO$x$N$y$) | 1.50 | 1067 nm |
| 15 | invention | silicon oxynitride (SiO$x$N$y$) | 1.60 | 1000 nm |
| 16 | | silicon oxynitride (SiO$x$N$y$) | 1.80 | 889 nm |
| 17 | | silicon nitride (SiN$x$) | 2.00 | 800 nm |
| 18 | | silicon carbide (SiC$x$) | 2.20 | 727 nm |

The conventional example did not use the third insulating layer 9 and had only the fourth insulating layer 10 made of silicon dioxide (SiO$_2$). Therefore, when the minimum width W of the aperture 2 is smaller than 1103 as shown in the combination example 13, the transmittance in the long wavelength range is decreased, resulting in a reduction of a sensitivity.

On the other hand, in examples of the solid state imaging device according to the embodiment of the invention, the third insulating layer 9 is made of a material having a higher refractive index than conventionally used materials as shown in the combination examples 14 to 18; whereby the minimum width W of the aperture 2 can be made smaller without changing the effective wavelength range of the solid state imaging device.

As discussed above, according to the present invention, the minimum width W of the aperture 2 and the refractive index n of the third insulating layer 9 are set appropriately with respect to the maximum wavelength λmax of the effective wavelength range of the solid state imaging device, whereby a sensitivity decrease at the maximum wavelength λmax is suppressed.

In particular, by using a material having a higher refractive index than conventionally used materials for the third insulating layer 9 so as to satisfy the above relationships as shown in the combination examples 2–6, 8–12, 14–18 of the above-described embodiments, the minimum width W of the aperture 2 can be made smaller without changing the effective wavelength range of the solid state imaging device. Thereby, a pixel size reduction is achieved, which in turn enables a reduction in size of the optical device and an increase in resolution.

While the third insulating layer 9 is not formed on the light shielding layer 1 in the above-described embodiments, it also may be formed on the light shielding layer 1. The third insulating layer 9 need not necessarily be a single layer as described in the foregoing but may have a multilayer structure that has an average refractive index n.

The present invention is not limited to CCD solid state imaging devices but also can be applied to amplified solid state imaging devices such as MOS solid state imaging devices with the same effects. The invention is also applicable to devices that include neither CCD charge transfer areas nor light shielding layers, such as some MOS solid state imaging devices, by adjusting the pitch of the signal lines on the pixels and the insulating layer between the lines in correspondence to the minimum width W of the light shielding layer 1 and the third insulating layer 9 of the above-described embodiments. By setting these parameters as described above, the same effects will be achieved.

In the case where several different kinds of color filters having different spectral characteristics such as primary color filters (red, green, and blue) or complementary color filters (yellow, cyan, magenta, and green) are provided above each aperture, the maximum wavelength λmax preferably should be determined by a cutoff wavelength on the long wavelength side of the color filter that has the longest cutoff wavelength on the long wavelength side (for example, red or magenta filter). In this case, all the apertures can have the same minimum width W.

Alternatively, when plural kinds of color filters having different spectral characteristics such as primary color filters or complementary color filters are provided above each aperture, the maximum wavelength λmax may be determined by a cutoff wavelength on the long wavelength side of each kind of color filter, so that the apertures have different minimum widths W optimally set in accordance with the colors of the filters.

The color filters can be any of dye filters, pigment filters, dielectric filters, or any other filters as long as they have desired spectral characteristics.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A photosensor comprising:
A semiconductor substrate provided with a light receiving portion for photoelectrically converting incident light and a signal readout portion for reading out signal charges accumulated in the light receiving portion;
a light shielding layer formed above the light receiving portion and having an aperture; and
a transparent insulating layer formed so as to fill the aperture;
wherein a relationship $2nW \geq \lambda max$ is satisfied, where W represents a minimum width of the aperture in the light shielding layer, n represents an average refractive index of the insulating layer in a region between a position corresponding to the uppermost surface of the light shielding layer along the aperture and the surface of the light receiving portion, and $\lambda max$ represents a maximum wavelength of the sensitive wavelength range of the light receiving portion.

2. The photosensor according to claim 1, wherein a relationship $nW \geq \lambda max$ is satisfied.

3. The photosensor according to claim 2, wherein a relationship $nW/2 \geq \lambda max$ is satisfied.

4. The photosensor according to claim 1, further comprising a color filter provided above the aperture,
wherein the maximum wavelength $\lambda max$ is a cutoff wavelength on the long wavelength side of spectral characteristics of the color filter.

5. The photosensor according to claim 4,
wherein a plurality of the light receiving portions are arranged on the semiconductor substrate, each light receiving portion having the aperture, and one of plural kinds of color filters having different spectral characteristics is provided above each of the apertures, and
wherein the minimum width W is determined with respect to the maximum wavelength $\lambda max$ represented by a cutoff wavelength on the long wavelength side of the one of the plural kinds of color filters that has a longest cutoff wavelength on the long wavelength side.

6. The photosensor according to claim 4,
wherein a plurality of the light receiving portions are arranged on the semiconductor substrate, each light receiving portion having the aperture, and one of plural kinds of color filters having different spectral characteristics is provided above each of the apertures, and
wherein the apertures have different minimum widths W in accordance with the kinds of the color filters, the minimum widths W of the apertures being determined with respect to the respective cutoff wavelengths on the long wavelength side of the spectral characteristics of the respective color filters so as to satisfy the relationship.

7. The photosensor according to claim 1, wherein the average refractive index n of the insulating layer is 1.50 or more.

8. The photosensor according to claim 1, wherein the insulating layer is formed of a silicon oxynitride film or a multilayer film including a silicon oxynitride film.

9. The photosensor according to claim 1, wherein the insulating layer is formed of a silicon nitride film or a multilayer film including a silicon nitride film.

10. The photosensor according to claim 1, wherein the insulating layer is formed of a silicon carbide film or a multilayer film including a silicon carbide film.

11. A solid state imaging device comprising: a photosensor according to claim 1; and circuits for processing signals obtained from the photosensor.

* * * * *